US009843158B2

(12) United States Patent
Wang et al.

(10) Patent No.: US 9,843,158 B2

(45) Date of Patent: Dec. 12, 2017

(54) OPTICAL MODULE

(71) Applicants: HISENSE BROADBAND MULTIMEDIA TECHNOLOGIES, LTD., Road Town (VG); HISENSE US CORPORATION, Suwanee, GA (US); HISENSE INTERNATIONAL CO., LTD., Qingdao (CN)

(72) Inventors: Li Wang, Qingdao (CN); Long Zheng, Qingdao (CN); Hua Zhang, Qingdao (CN)

(73) Assignees: HISENSE BROADBAND MULTIMEDIA TECHNOLOGIES CO., LTD., Shandong (CN); HISENSE BROADBAND MULTIMEDIA TECHNOLOGIES, LTD., Tortola (VG)

( * ) Notice: Subject to any disclaimer, the term of this patent is extended or adjusted under 35 U.S.C. 154(b) by 0 days.

(21) Appl. No.: 15/294,544

(22) Filed: Oct. 14, 2016

(65) Prior Publication Data

US 2017/0256907 A1 Sep. 7, 2017

(30) Foreign Application Priority Data

Mar. 2, 2016 (CN) .......................... 2016 1 0118438

(51) Int. Cl.

| | |
|---|---|
| ***H01S 5/026*** | (2006.01) |
| ***H01S 5/042*** | (2006.01) |
| *H01S 3/091* | (2006.01) |

(52) U.S. Cl.

CPC ............ *H01S 5/0261* (2013.01); *H01S 5/042* (2013.01); *H01S 3/0912* (2013.01)

(58) Field of Classification Search

CPC ...... H01S 5/0261; H01S 2/0912; H01S 5/042; H01S 3/0912

See application file for complete search history.

(56) References Cited

U.S. PATENT DOCUMENTS

| | | | | |
|---|---|---|---|---|
| 5,604,757 A * | 2/1997 | Liang | H01S 5/042 372/29.012 |
| 2006/0098699 A1* | 5/2006 | Sanchez | H01S 5/068 372/26 |
| 2009/0022068 A1* | 1/2009 | Iyer | H04L 41/0806 370/254 |
| 2016/0226217 A1* | 8/2016 | Jia | H04B 10/07 |

* cited by examiner

*Primary Examiner* — Xinning Niu

(74) *Attorney, Agent, or Firm* — J.C. Patents

(57) ABSTRACT

The present application provides an optical module comprising: a golden finger, a MAC chip, a switch circuit, a laser driver, and a laser. A first output terminal of the MAC chip is connected to a first input terminal of the laser driver for inputting burst controlling signal thereto; a second output terminal of the MAC chip is connected to a first input terminal of the switch circuit for inputting cut-off controlling signal thereto; a cut-off controlling pin of the golden finger is connected to a second input terminal of the switch circuit for inputting cut-off controlling signal thereto; and an output terminal of the switch circuit is connected to a second input terminal of the laser driver. The switch circuit is used to connect the first or the second input terminal of the switch circuit with the output terminal. The cut-off controlling signal controls the switch-off of the laser.

9 Claims, 6 Drawing Sheets

OPTICAL MODULE

CROSS-REFERENCE TO RELATED APPLICATIONS

The present application claims the benefit of Chinese Patent Application No. 201610118438.9, filed on Mar. 2, 2016 and entitled "Optical Module", which is hereby incorporated by reference in its entirety.

TECHNICAL FIELD

The present application relates to the field of optical communication technologies and, in particular, to an optical module.

BACKGROUND

As people's demand for higher communication bandwidth continues to grow, Fiber-to-the-x (FTTx) techniques have seen rapid developments, and FTTx techniques spearheaded by Passive Optical Networks (PONs) have been put to an array of applications.

The PON typically includes an optical line terminal (OLT) mounted at a centralized control station, and optical network units (ONUs) correspondingly mounted at various user sites. The ONU is provided with a laser which emits light, as well as a laser driver which drives the laser to emit the light. Since the OLT must be coupled to a plurality of ONUs during an interfacing transaction between the OLT and the ONU, each ONU is allocated with a specific operation period. When in non-operation mode, an ONU does not emit light. If light is nonetheless emitted, the ONU will be found to be in a rogue state, a situation that requires the laser driver to cut-off.

In prior arts, one way to control the cut-off of the laser driver is software control, which is typically performed at program level, with a cut-off command being communicated via a bus, i.e. an inter-integrated circuit (I2C), to the laser driver so that the laser driver may carry out the cut-off process.

SUMMARY

Some embodiments of the present application provide an optical module, including:

a golden finger, a MAC chip, a switch circuit, a laser driver, and a laser;

where the switch on or switch off of the laser is controlled by the laser driver;

a first output terminal of the MAC chip is connected to a first input terminal of the laser driver for inputting burst controlling signal to the laser driver; and the burst controlling signal is used to control the laser to be in a burst mode;

a second output terminal of the MAC chip is connected to a first input terminal of the switch circuit for inputting cut-off controlling signal to the first input terminal;

a cut-off controlling pin of the golden finger is connected to a second input terminal of the switch circuit for inputting cut-off controlling signal to the second input terminal;

an output terminal of the switch circuit is connected to a second input terminal of the laser driver, and the switch circuit is used to connect the first input terminal of the switch circuit with the output terminal of the switch circuit or connect the second input terminal of the switch circuit with the output terminal of the switch circuit; and the cut-off controlling signal is used to control the switch-off of the laser.

BRIEF DESCRIPTION OF DRAWINGS

A brief introduction will be given hereinafter to the accompany drawings which will be used in the description of the embodiments or prior art in order to explain the technical solutions of the embodiments of the present application or prior art more clearly. Apparently, the drawings in the description below are merely illustrating some embodiments of the present application. Those skilled in the art may derive other drawings according to these drawings without paying any creative labor.

DESCRIPTION OF EMBODIMENTS

In order to make the purposes, the technical solutions and the advantages of the present application clearer, a clear and full description will be given to the technical solution of the present application with reference to the accompanying drawings. Obviously, the described embodiments are only part of the embodiments of the present application, rather than all of them. According to the embodiments of the present application, all of the other embodiments obtained by those with ordinary skill in the art without consuming any creative work fall within the protection scope of the present application.

An optical module (OM) involved in some embodiments of the present application include, but not limited to, an OM with media access control (MAC) chip, a conventional OM, and the like.

Technical solutions of the present application will be explained in detail herein under with reference to particular embodiments. Particular embodiments below may be combined, and same or similar concepts or processes are not repeated in some embodiments.

Figure 1:
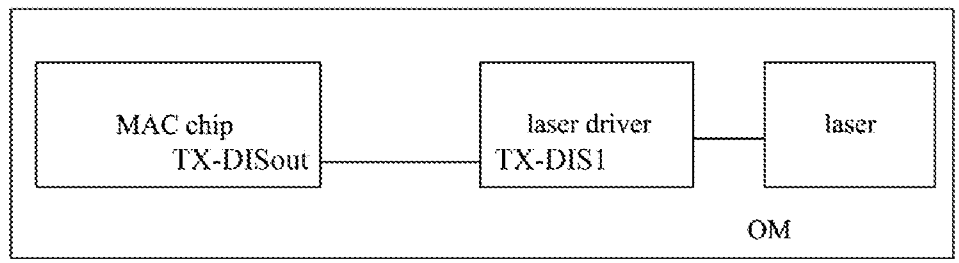
FIG. 1 is a schematic structural diagram of an optical module according to some embodiments of the present application.

FIG. 1 is a schematic structural diagram of an OM according to some embodiments of the present application. As shown in FIG. 1, the OM includes:

a MAC chip, a laser driver, and a laser;

where the laser is connected to the laser driver; and the switch on or switch off of the laser is controlled by the laser driver;

a second output terminal TX-DISout of the MAC chip is connected to the second input terminal TX-DIS1 of the laser driver for outputting a cut-off controlling signal, and the cut-off controlling signal is used to control the laser to switch off.

In particular, one OLT is connected to a plurality of ONUs during an interfacing transaction between the OLT and the ONU, and each ONU is allocated with a specific operation period. When in non-operation mode, the ONU does not emit light. If light is nonetheless emitted, a rogue state is found. The ONU has a rogue state self-detection function that, whenever a rogue state is detected by the MAC chip, a cut-off controlling signal may be outputted, via the TX-DISout, to enable the DISABLE function of the second input terminal of the laser driver so that the laser is controlled to switch off and stop emitting light. Meanwhile, the laser may also be cut-off the laser in this manner when a cut-off controlling signal is received by the ONU from the OLT.

The DISABLE function of the laser driver typically has a threshold voltage. For example, when <1.6V, the DISABLE is disabled, and the laser driver may operate; or when >1.7V, the DISABLE is enabled, and the laser driver may not operate.

The TX-DIS1 pin of the laser driver serves as an input port. When an external input signal is at high level (such as more than 2.4 V), the laser driver responds to the DISABLE state and cut-off a controlling power source of the laser. When the external input signal is at low level (such as less than 0.8V), the laser driver responds to the DISABLE releasing state and turn-on the controlling power source of the laser.

One of the input/output (I/O) ports of the MAC chip is configured to be the TX-DISout that serves as the output pin for the DISABLE enabling signal.

An OM shown in FIG. 1 includes an MAC chip, a laser driver, and a laser. The second output terminal of the MAC chip is connected to the second input terminal of the laser driver for outputting a cut-off controlling signal that controls the laser to be switched off. Whenever the MAC chip detects a rogue state, the MAC chip outputs a cut-off controlling signal, via the first output terminal, to cause the laser driver to be switched off and stop emitting light.

Figure 2:
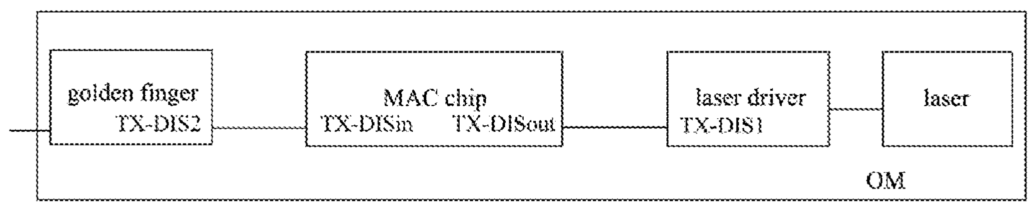
FIG. 2 is a schematic structural diagram of another optical module according to some embodiments of the present application.

FIG. 2 is a schematic structural diagram of an OM according to some embodiments of the present application. On the basis of the implementation mode shown in FIG. 1, an OM in actual application further includes:

a golden finger;

where a cut-off controlling pin TX-DIS2 of the golden finger is connected to a cut-off controlling input pin TX-DISin of the MAC chip. The TX-DIS2 pin of the golden finger is used to receive cut-off controlling signals from the external system of the OM, and to forward the cut-off controlling signals, via the MAC chip, to a second input terminal TX-DIS1 of the laser driver. Wherein golden fingers are a number of golden electro-conductive contact sheets, and since they are coated with gold on their surfaces, and arranged like fingers, they are called “golden fingers”.

For an OM incorporating a MAC chip, the golden finger has a cut-off controlling pin TX-DIS2. Thus, in addition to employing the self-detection function of the MAC chip to control the switching-off of the laser, the cut-off controlling signal may also be feed in via the TX-DIS2 pin when the external system of the OM detects that the laser needs to be switched off, so that the signal may be forwarded by the MAC chip to the second input terminal TX-DIS1 of the laser driver in order to cause the laser to switch off.

The MAC chip may be disposed with two I/O ports, with one of the ports being configured as the TX-DISin, i.e. the input pin for the cut-off controlling signals, and the other being configured as the TX-DISout, i.e. the output pin for the cut-off controlling signals.

In case a faulty state happens, such as a rogue state, in one aspect, a DISABLE instruction from a external system may be forwarded via the MAC chip to the laser driver so as to control the performance of the DISABLE function thereof; in another aspect, the MAC chip may directly control the output of the cut-off controlling signal from the TX-DISout in order to control the laser driver, which in turn controls the switching-off of the laser, thereby realizing control over the laser in case of faulty states, such as rogue state. Thus, two control modes, i.e. a DISABLE external to the OM and a DISABLE internal in the OM, are realized.

Figure 3:
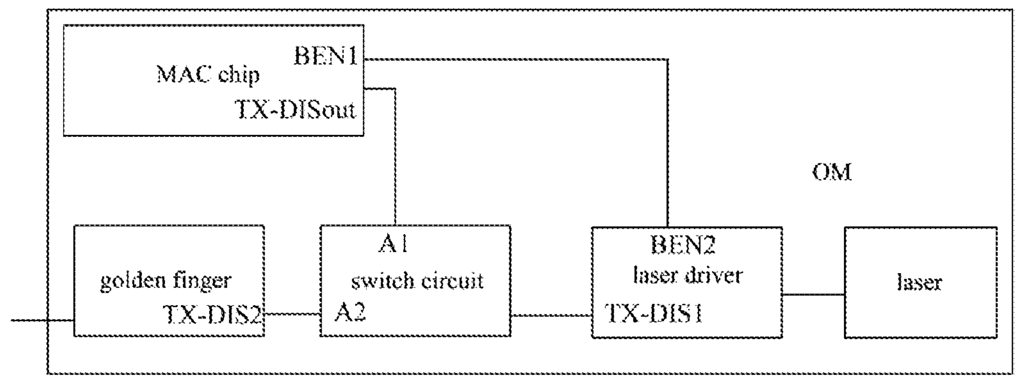
FIG. 3 is a schematic structural diagram of yet another optical module according to some embodiments of the present application.

FIG. 3 is a schematic structural diagram of another embodiment of an OM of the present application. The OM includes:

a golden finger, a MAC chip, a switch circuit, a laser driver, and a laser;

where the switch on or switch off of the laser is controlled by the laser driver;

a first output terminal BEN1 of the MAC chip is connected to a first input terminal BEN2 of the laser driver for inputting burst controlling signal to the laser driver, and the burst controlling signal is used to control the laser to be in a burst mode;

a second output terminal TX-DISout of the MAC chip is connected to a first input terminal A1 of the switch circuit for inputting cut-off controlling signal to the first input terminal;

a cut-off controlling pin TX-DIS2 of the golden finger is connected to a second input terminal A2 of the switch circuit for inputting cut-off controlling signal to the second input terminal;

an output terminal of the switch circuit is connected to a second input terminal TX-DIS1 of the laser driver, and the switch circuit used to connect the first input terminal A1 of the switch circuit with the output terminal or connect the second input terminal A2 of the switch circuit with the output terminal; and the cut-off controlling signal is used to control the switching-off of the laser.

To achieve a controlling of the DISABLE functionality of the laser driver by both internal and external of the OM, in the present embodiment, the second output terminal TX-DISout of the MAC chip is connected to the first input terminal A1 of the switch circuit, and the cut-off controlling pin TX-DIS2 of the golden finger is connected to a second input terminal A2 of the switch circuit, so that by controlling the connectivity between the first input terminal A1 and the output terminal of the switch circuit, as well as the second input terminal A2 and the output terminal of the switch circuit, the control over the cut-off controlling signal from the MAC chip and the external system can be realized.

The cut-off controlling pin TX-DIS2 of the golden finger is arranged to deliver cut-off controlling signals, i.e. high level signals, from the external system. The aforementioned cut-off controlling signals are used to control the enabling of the DISABLE functionality of the laser driver in order to cause the laser to switch off.

When a cut-off controlling signal is fed in externally, the switch circuit connects the second input terminal A2 with the output terminal of the switch circuit, so that the cut-off controlling signal is transmitted to the second input terminal TX-DIS1 of the laser driver, thereby enabling the DISABLE functionality of the laser driver.

Alternatively, when the MAC chip outputs the cut-off controlling signal, the switch circuit connects the first input terminal A1 with the output terminal of the switch circuit, so that the cut-off controlling signal is transmitted to the second input terminal TX-DIS1 of the laser driver, thereby enabling the DISABLE functionality of the laser driver.

The DISABLE functionality of the laser driver is not enabled only when no cut-off controlling signal output is outputted, no matter from external of the OM or the MAC chip.

When a cut-off controlling signal output is outputted from both external of the OM and the MAC chip, the signal output level from external of the OM will not be dragged low by the MAC chip, nor will that of the MAC chip be dragged low from external of the OM, hence the DISABLE functionality of the laser driver is enabled.

Since the switch unit is used to connect the first input terminal A1 with the output terminal of the switch circuit when a cut-off controlling signal is received at the first input terminal A1, and to connect the second input terminal with the output terminal of the switch circuit when a cut-off controlling signal is received at the second input terminal A2, as long as one of the MAC chip or the golden finger outputs a cut-off controlling signal, the switch circuit will pass on the signal to the second input terminal TX-DIS1 of the laser driver in order to enable the DISABLE functionality of the laser driver. The DISABLE functionality of the laser driver is not enabled only when neither source outputs any cut-off controlling signal.

Compared with the configuration shown in FIG. 2, the external cut-off controlling signal does not require being forwarded by the MAC chip, therefore suffering no delay.

In case a faulty state happens, such as a rogue state, in one aspect, a DISABLE instruction from an external system may directly act on the laser driver to control the performance of the DISABLE function thereof; in another aspect, the MAC chip may directly control the output of the cut-off controlling signal from the TX-DISout in order to control the laser driver, which in turn controls the switching-off of the laser, thereby realizing control over the laser in case of faulty states, such as rogue state. Thus, two control modes, i.e. a DISABLE external to the OM and a DISABLE internal in the OM, are realized.

The first output terminal BEN1 of the MAC chip is connected to the first input terminal BEN2 of the laser driver for inputting burst controlling signal to the laser driver, and the burst controlling signal is used to control the laser to be in a burst mode. One way for outputting the burst controlling signal is to allow the MAC chip to generate and output the signal. Another way is to allow the burst controlling signal to be externally feed into the MAC chip, so that the MAC chip outputs the received burst controlling signal. In this way, compatibilities with SFF protocol and SFP protocol are realized.

The optical module provided by those embodiments include a golden finger, a MAC chip, a switch circuit, a laser driver, and a laser, where a first output terminal of the MAC chip is connected to a first input terminal of the laser driver for inputting burst controlling signal thereto, a second output terminal of the MAC chip is connected to a first input terminal of the switch circuit for inputting cut-off controlling signal to the first input terminal, a cut-off controlling pin of the golden finger is connected to a second input terminal of the switch circuit for inputting cut-off controlling signal to the second input terminal; and an output terminal of the switch circuit connected to a second input terminal of the laser driver, where the switch circuit is configured such that the first input terminal or the second input terminal of the switch circuit is connected to the output terminal thereof, and the cut-off controlling signal is configured to control the switch-off of the laser. When the MAC chip detects a rogue state, the MAC chip outputs a cut-off controlling signal, via the second output terminal, to control the switch circuit to feed the cut-off controlling signal into the second input terminal of the laser driver in order to control the laser to be switched off. When the external system detects a rogue state, the external system may also feed a cut-off controlling signal, via the cut-off controlling pin of the golden finger, into the second input terminal of the switch circuit, and act through the switch circuit to feed the cut-off controlling signal into the second input terminal of the laser driver in order to control the laser to be switched off. The switch circuit can keep the cut-off signal from the MAC chip and the external system independent, and both capable of realizing the switch-off of the laser by controlling the enabling of the DISABLE functionality of the laser driver.

Figure 4:
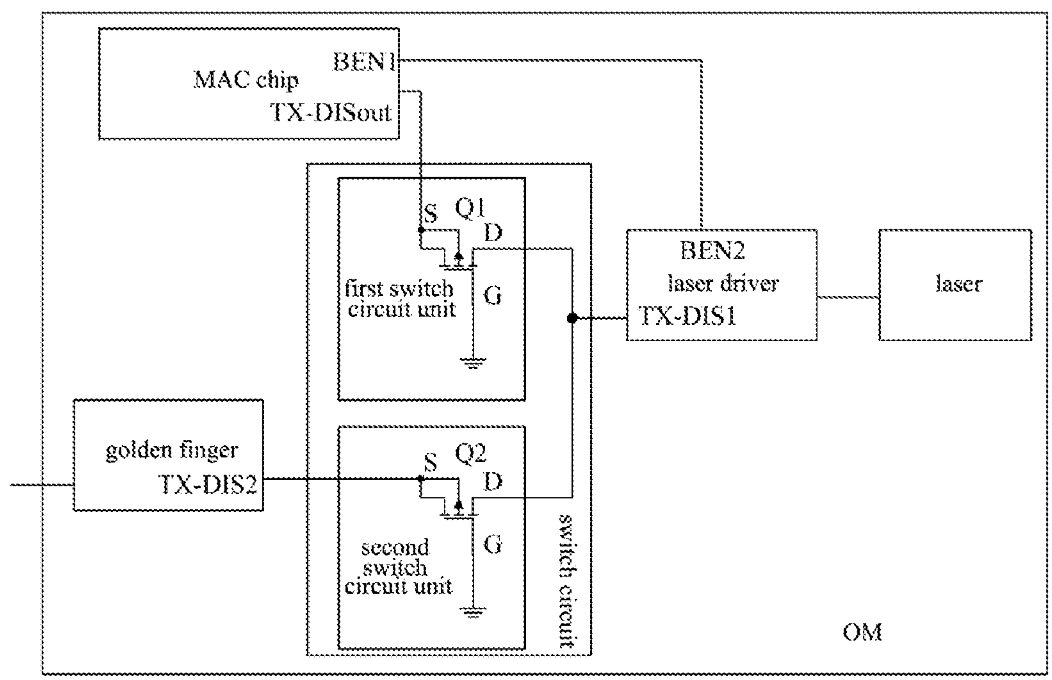
FIG. 4 is a schematic structural diagram of yet another optical module according to some embodiments of the present application.

FIG. 4 is a schematic structural diagram of an OM provided in some embodiments of the present application. On the basis of the implementation mode shown in FIG. 3, the switch circuit may be implemented by various means. As one of the possible implementation modes, in the present embodiment, the switch circuit includes a first switch circuit unit, and a second switch circuit unit;

where the first switch circuit unit includes a first Metal Oxide Semiconductor (MOS) transistor Q1;

where a source S of the first MOS transistor Q1 is connected to the second output terminal TX-DISout of the MAC chip, a drain D of the first MOS transistor Q1 is connected to the second input terminal TX-DIS1 of the laser driver, and a gate G of the first MOS transistor Q1 is grounded;

the second switch circuit unit includes a second MOS transistor Q2;

where a source S of the second MOS transistor Q2 is connected to the cut-off controlling pin TX-DIS2 of the golden finger, a drain D of the second MOS transistor Q2 is connected to the second input terminal TX-DIS1 of the laser driver, and a gate of the second MOS transistor Q2 is grounded.

The first switch circuit unit controls the connectivity between the second output terminal TX-DISout of the MAC chip and the second input terminal TX-DIS1 of the laser driver, and the second switch circuit unit controls the connectivity between the cut-off controlling pin TX-DIS2 of the golden finger and the second input terminal TX-DIS1 of the laser driver.

When a cut-off controlling signal, such as a high level signal, is fed in externally, the second MOS transistor Q2 of the second switch circuit becomes conductive, so that the cut-off controlling signal is transmitted to the second input terminal TX-DIS1 of the laser driver, thereby enabling the DISABLE functionality of the laser driver, and controlling the laser to be switched off.

When the MAC chip outputs a cut-off controlling signal, such as a high level signal, the first MOS transistor Q1 of the first switch circuit becomes conductive, so that the cut-off controlling signal is transmitted to the second input terminal TX-DIS1 of the laser driver, thereby enabling the DISABLE functionality of the laser driver, and controlling the laser to be switched off.

When no cut-off controlling signal output is detected, whether from external of the OM or the MAC chip, neither the first MOS transistor Q1 of the first switch circuit nor the second MOS transistor Q2 of the second switch circuit is conductive, and the DISABLE functionality of the laser driver is not enabled.

When the MAC chip outputs a cut-off controlling signal while the external system outputs none, the first MOS transistor Q1 of the first switch circuit becomes conductive while the second MOS transistor Q2 of the second switch circuit is not, hence the MAC chip may output the cut-off controlling signal, independent of any interference from the external system, to enable the DISABLE functionality of the laser driver. When the external system outputs a cut-off controlling signal while the MAC chip outputs none, the second MOS transistor Q2 of the second switch circuit becomes conductive while the first MOS transistor Q1 of the first switch circuit is not, hence the external system may feed in the cut-off controlling signal via the golden finger, independent of any interference from the MAC chip, to enable the DISABLE functionality of the laser driver.

It can be appreciated by those of ordinary skill in the art that any electronic part and/or component, or a combination thereof, which may realize switching functionality, can serve as the implementation mode of the switch circuit.

For example, the first switch circuit may include a third BJT, and the second switch circuit may include a fourth BJT.

When a cut-off controlling signal, such as a high level signal, is fed in externally, the fourth BJT of the second switch circuit becomes conductive, so that the cut-off controlling signal is transmitted to the second input terminal TX-DIS1 of the laser driver, thereby enabling the DISABLE functionality of the laser driver, and controlling the laser to be switched off.

When the MAC chip outputs a cut-off controlling signal, such as a high level signal, the third BJT of the first switch circuit becomes conductive, so that the cut-off controlling signal is transmitted to the second input terminal TX-DIS1 of the laser driver, thereby enabling the DISABLE functionality of the laser driver, and controlling the laser to be switched off.

When no cut-off controlling signal output is detected, whether from external of the OM or the MAC chip, neither the third BJT of the first switch circuit nor the fourth BJT of the second switch circuit is conductive, and the DISABLE functionality of the laser driver is not enabled.

When the MAC chip outputs a cut-off controlling signal while the external system outputs none, the third BJT of the first switch circuit becomes conductive while the fourth BJT of the second switch circuit is not, hence the MAC chip may output the cut-off controlling signal, independent of any interference from the external system, to enable the DISABLE functionality of the laser driver.

When the external system outputs a cut-off controlling signal while the MAC chip outputs none, the fourth BJT of the second switch circuit becomes conductive while the third BJT of the first switch circuit is not, hence the external system may feed in the cut-off controlling signal via the golden finger, independent of any interference from the MAC chip, to enable the DISABLE functionality of the laser driver.

Figure 5:
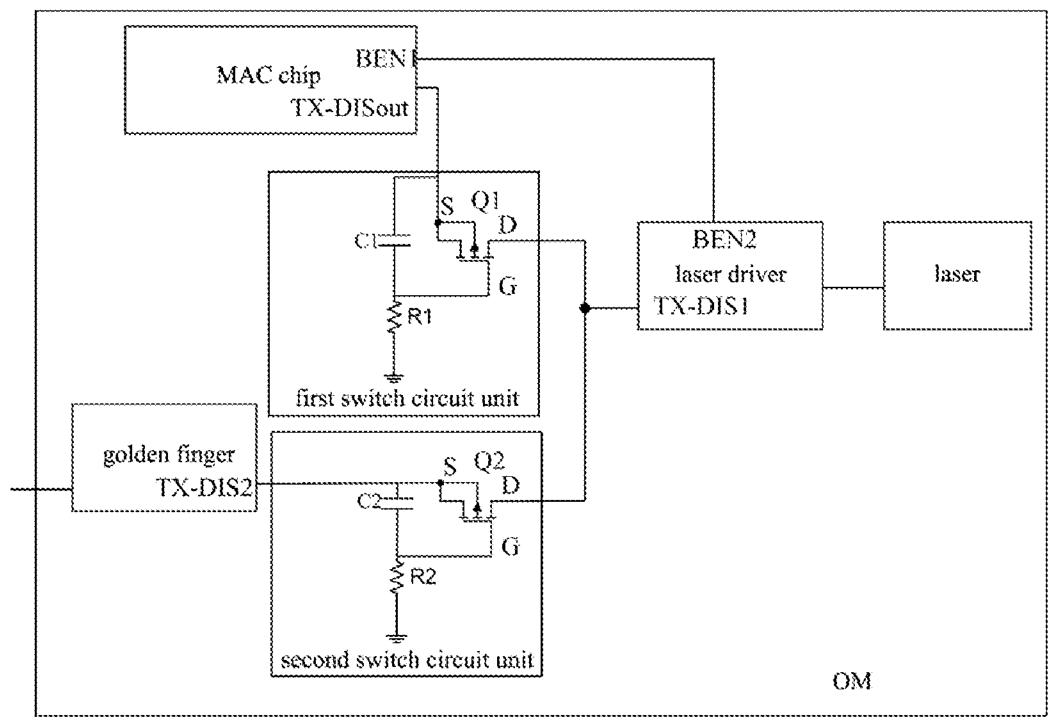
FIG. 5 is a schematic structural diagram of yet another optical module according to some embodiments of the present application.

FIG. 5 is a schematic structural diagram of an OM provided in some embodiments of the present application. On the basis of the implementation mode shown in FIG. 4, the first switch circuit unit may further include a first capacitor C1 and a first resistor R1; where one terminal of the first capacitor C1 is connected to the second output terminal TX-DISout of the MAC chip, and the other terminal of the first capacitor C1 is connected to one terminal of the first resistor R1.

The one terminal of the first resistor R1 is further connected to the gate G of the first MOS transistor Q1, and the other terminal of the first resistor R1 is grounded.

The second switch circuit unit further includes a second capacitor C2 and a second resistor R2.

Where, one terminal of the second capacitor C2 is connected to the cut-off controlling pin TX-DIS2 of the golden finger, and the other terminal of the second capacitor C2 is connected to one terminal of the second resistor R2.

The one terminal of the second resistor R2 is further connected to the gate G of the second MOS transistor Q2, and the other terminal of the second resistor R2 is grounded.

The first capacitor C1 and first resistor R1 in the first switch circuit unit mainly serve to maintain stability of the circuitry. The second capacitor C2 and second resistor R2 in the second switch circuit unit mainly serve to maintain stability of the circuitry, too.

The aforementioned resistors and capacitors may prevent overshooting of high level output.

Figure 6:
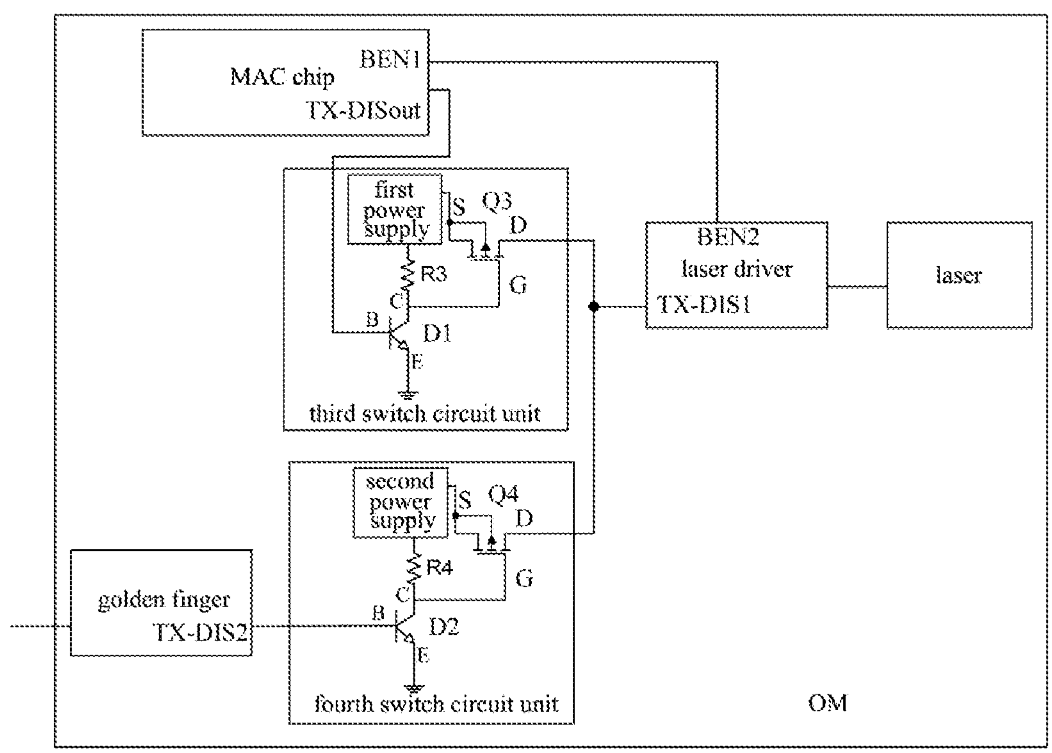
FIG. 6 is a schematic structural diagram of yet another optical module according to some embodiments of the present application.

FIG. 6 is a schematic structural diagram of an OM provided in some embodiments of the present application. On the basis of the implementation mode shown in FIG. 3, as another possible implementation mode of the switch circuit, in the present embodiment, the switch circuit includes a third switch circuit unit, and a fourth switch circuit unit, where the third switch circuit unit further includes:

a first bipolar junction transistor (BJT) D1, a third MOS transistor Q3, a third resistor R3, and a first power supply;

Here, the base B of the first BJT D1 is connected to the second output terminal TX-DISout of the MAC chip, the collector C of the first BJT D1 is connected to the first power supply and the gate G of the third MOS transistor Q3 respectively, and the emitter E of the first BJT D1 is grounded;

The source S of the third MOS transistor Q3 is connected to the first power supply, the drain D of the third MOS transistor Q3 is connected to the second input terminal TX-DIS1 of the laser driver;

One terminal of the third resistor R3 is connected to the first power supply, and the other terminal of the third resistor R3 is connected to the gate G of the third MOS transistor Q3 and the collector C of the first BJT D1, respectively;

The fourth switch circuit unit includes a second BJT D2, a fourth MOS transistor Q4, a fourth resistor R4, and a second power supply;

Here, the base B of the second BJT D2 is connected to the cut-off controlling pin TX-DIS2 of the golden finger, the collector C of the second BJT D2 is connected to the second power supply and a gate G of the fourth MOS transistor Q4 respectively, and the emitter E of the second BJT D2 is grounded;

The source S of the fourth MOS transistor Q4 is connected to the second power supply, the drain D of the fourth MOS transistor Q4 is connected to the second input terminal TX-DIS1 of the laser driver;

One terminal of the fourth resistor R4 is connected to the second power supply, and the other terminal of the fourth resistor R4 is connected to the gate G of the fourth MOS transistor Q4 and the collector C of the second BJT D2, respectively.

The above configurations allow the first switch circuit unit to control the connectivity between the second output terminal of the MAC chip and the second input terminal of the laser driver, and the second switch circuit unit to controls the connectivity between the cut-off controlling pin TX-DIS2 of the golden finger and the second input terminal TX-DIS1 of the laser driver.

In the implementation mode shown in FIG. 6, when the TX-DISout outputs a cut-off controlling signal, such as a high level signal, the first BJT D1 becomes conductive, causing the third MOS transistor Q3 to be conductive, thereby transmitting the cut-off controlling signal to the second input terminal of the laser driver, enabling the DISABLE functionality of the laser driver, hence controlling the laser to be switched off.

When the TX-DIS2 outputs a cut-off controlling signal, such as a high level signal, the second BJT D2 becomes conductive, causing the fourth MOS transistor Q4 to be conductive, thereby transmitting the cut-off controlling signal to the second input terminal of the laser driver, enabling the DISABLE functionality of the laser driver, hence controlling the laser to be switched off.

When no cut-off controlling signal output is detected, whether from external of the OM or the MAC chip, neither the third MOS transistor Q3 of the first switch circuit nor the fourth MOS transistor Q4 of the second switch circuit is conductive, and the DISABLE functionality of the laser driver is not enabled.

When only one of the MAC chip and the golden finger outputs the cut-off controlling signal, the signal level being pulled low can be prevented because the other switch circuit unit is not connected. In this case, the one switch circuit unit that becomes connected will transmit the cut-off controlling signal to the second input terminal of the laser driver, enabling the DISABLE functionality of the laser driver, hence controlling the laser to be switched off.

Figure 7:
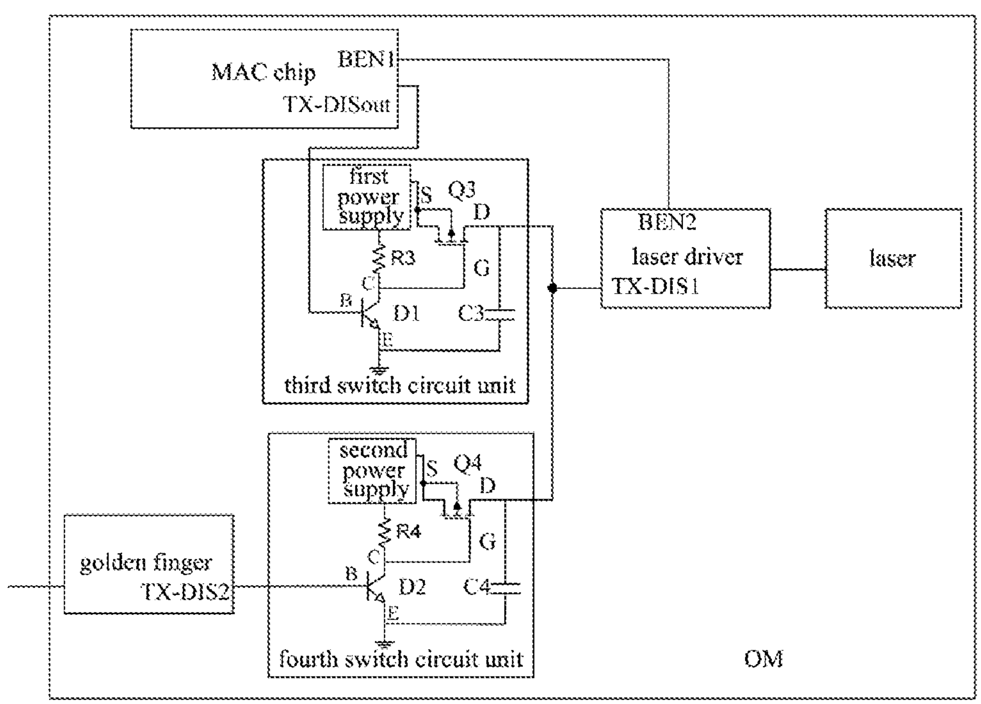
FIG. 7 is a schematic structural diagram of yet another optical module according to some embodiments of the present application.

Where, in actual application, the first switch circuit unit and the second switch circuit unit may be embodied in a single-chip microcomputer (SCM). Alternatively, the switch circuit may also be embodied in a SCM having two input ports and on output port. FIG. 7 is a schematic structural diagram of an OM provided in some embodiments of the present application. On the basis of the implementation mode shown in FIG. 6, the third switch circuit unit may further include a third capacitor C3 and a third resistor R3.

Where, one terminal of the third capacitor C3 is connected to the drain D of the third MOS transistor Q3, and the other terminal of the third capacitor C3 is grounded.

The fourth switch circuit unit further includes a fourth capacitor C4 and a fourth resistor R4.

Where, one terminal of the fourth capacitor C4 is connected to the drain D of the fourth MOS transistor Q4, and the other terminal of the fourth capacitor C4 is grounded.

The third capacitor C3 and third resistor R3 in the first switch circuit unit mainly serve to maintain stability of the circuitry. The fourth capacitor C4 and fourth resistor R4 in the second switch circuit unit mainly serve to maintain stability of the circuitry, too.

Figure 8:
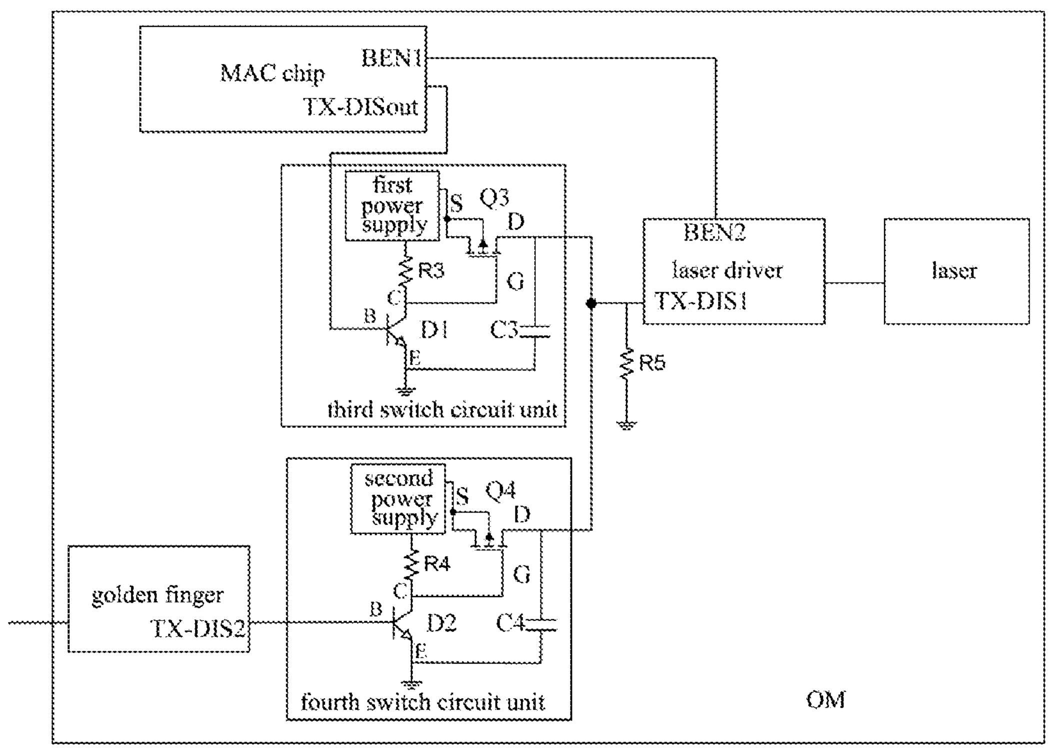
FIG. 8 is a schematic structural diagram of yet another optical module according to some embodiments of the present application.

FIG. 8 is a schematic structural diagram of an OM provided in some embodiments of the present application. Furthermore, on the basis of any one of the implementation modes shown in FIGS. 3-7, there may further include:

a fifth resistor R5 having one terminal connected to the second input terminal of the laser driver and the other terminal being grounded.

The fifth resistor R5 mainly serves to maintain stability of the circuitry.

FIG. 8 only shows a case where a fifth resistor is added to the circuitry shown in FIG. 7. Other cases, which are essentially similar, will not be repeated herein.

The value of the resistance and capacitance of the resistor and capacitor in embodiments of the present application may be selected according to actual situations, and different values support different switching times.

Finally, it should be noted that the foregoing embodiments are merely intended for describing the technical solutions of the present application rather than limiting the present application. Although the present application is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present application.

What is claimed is:

1. An optical module, comprising:

a golden finger, a media access control (MAC) chip, a switch circuit, a laser driver, and a laser; wherein, a first output terminal of the MAC chip is connected to a first input terminal of the laser driver for inputting burst controlling signal to the laser driver; and the burst controlling signal is used to control the laser to be in a burst mode;

a second output terminal of the MAC chip is connected to a first input terminal of the switch circuit for inputting cut-off controlling signal to the first input terminal of the switch circuit;

a cut-off controlling pin of the golden finger is connected to a second input terminal of the switch circuit for inputting cut-off controlling signal to the second input terminal of the switch circuit;

an output terminal of the switch circuit is connected to a second input terminal of the laser driver; and the switch circuit is used to connect the first input terminal of the switch circuit with the output terminal of the switch circuit or connect the second input terminal of the switch circuit with the output terminal of the switch circuit; and the laser driver controls the laser to switch-off according to the cut-off controlling signal.

2. The optical module according to claim 1, wherein the switch circuit comprises:

a first switch circuit unit, and a second switch circuit unit;

wherein the first switch circuit unit comprises a first Metal Oxide Semiconductor (MOS) transistor;

wherein a source of the first MOS transistor is connected to the second output terminal of the MAC chip, a drain of the first MOS transistor is connected to the second input terminal of the laser driver, and a gate of the first MOS transistor is grounded;

the second switch circuit unit comprises a second MOS transistor;

wherein a source of the second MOS transistor is connected to the cut-off controlling pin of the golden finger, a drain of the second MOS transistor is connected to the second input terminal of the laser driver, and a gate of the second MOS transistor is grounded.

3. The optical module according to claim 2, wherein the first switch circuit unit further comprises a first capacitor and a first resistor;

wherein one terminal of the first capacitor is connected to the second output terminal of the MAC chip, and the other terminal of the first capacitor is connected to one terminal of the first resistor; and the one terminal of the first resistor is further connected to the gate of the first MOS transistor, and the other terminal of the first resistor is grounded;

the second switch circuit unit further comprises a second capacitor and a second resistor;

wherein one terminal of the second capacitor is connected to the cut-off controlling pin of the golden finger, and the other terminal of the second capacitor is connected to one terminal of the second resistor; and the one terminal of the second resistor is further connected to the gate of the second MOS transistor, and the other terminal of the second resistor is grounded.

4. The optical module according to claim 1, wherein the switch circuit comprises:

a third switch circuit unit, and a fourth switch circuit unit;

wherein the third switch circuit unit comprises a first bipolar junction transistor (BJT), a third MOS transistor, a third resistor, and a first power supply;

wherein a base of the first BJT is connected to the second output terminal of the MAC chip, a collector of the first BJT is connected to the first power supply and a gate of the third MOS transistor respectively, and an emitter of the first BJT is grounded;

a source of the third MOS transistor is connected to the first power supply, and a drain of the third MOS transistor is connected to the second input terminal of the laser driver;

one terminal of the third resistor is connected to the first power supply, and the other terminal of the third resistor is connected to the gate of the third MOS transistor and the collector of the first BJT, respectively;

the fourth switch circuit unit comprises a second BJT, a fourth MOS transistor, a fourth resistor, and a second power supply;

wherein a base of the second BJT is connected to the cut-off controlling pin of the golden finger, a collector of the second BJT is connected to the second power supply and a gate of the fourth MOS transistor respectively, and an emitter of the second BJT is grounded;

a source of the fourth MOS transistor is connected to the second power supply, and a drain of the fourth MOS transistor is connected to the second input terminal of the laser driver, and one terminal of the fourth resistor is connected to the second power supply, and the other terminal of the fourth resistor is connected to the gate of the fourth MOS transistor and the collector of the second BJT, respectively.

5. The optical module according to claim 4, wherein the third switch circuit unit further comprises a third capacitor;

wherein one terminal of the third capacitor is connected to the drain of the third MOS transistor, and the other terminal of the third capacitor is grounded;

the fourth switch circuit unit further comprises a fourth capacitor;

wherein one terminal of the fourth capacitor is connected to the drain of the fourth MOS transistor, and the other terminal of the fourth capacitor is grounded.

6. The optical module according to claim 2, further comprising: a fifth resistor; wherein, one terminal of the fifth resistor is connected to the second input terminal of the laser driver, and the other terminal of the fifth resistor is grounded.

7. The optical module according to claim 3, further comprising: a fifth resistor; wherein, one terminal of the fifth resistor is connected to the second input terminal of the laser driver and the other terminal of the fifth resistor is grounded.

8. The optical module according to claim 4, further comprising: a fifth resistor; wherein, one terminal of the fifth resistor is connected to the second input terminal of the laser driver and the other terminal of the fifth resistor is grounded.

9. The optical module according to claim 5, further comprising: a fifth resistor; wherein, one terminal of the fifth resistor is connected to the second input terminal of the laser driver, and the other terminal of the fifth resistor is grounded.

* * * * *